US006693454B2

(12) United States Patent
Cox

(10) Patent No.: US 6,693,454 B2
(45) Date of Patent: Feb. 17, 2004

(54) DISTRIBUTED RAM IN A LOGIC ARRAY

(75) Inventor: William D. Cox, Chapel Hill, NC (US)

(73) Assignee: ViASIC, Inc., Chapel Hill, NC (US)

( * ) Notice: Subject to any disclaimer, the term of this patent is extended or adjusted under 35 U.S.C. 154(b) by 0 days.

(21) Appl. No.: 10/150,685

(22) Filed: May 17, 2002

(65) Prior Publication Data

US 2003/0214322 A1 Nov. 20, 2003

(51) Int. Cl.⁷ .............................................. H03K 19/177
(52) U.S. Cl. ............................ 326/39; 326/40; 326/41; 326/38
(58) Field of Search ...... 326/38–41; 365/189.01–189.08

(56) References Cited

U.S. PATENT DOCUMENTS

| 5,068,603 | A | | 11/1991 | Mahoney | |
|---|---|---|---|---|---|
| 5,815,004 | A | * | 9/1998 | Trimberger et al. | 326/41 |
| 5,825,202 | A | * | 10/1998 | Tavana et al. | 326/39 |
| 5,874,834 | A | * | 2/1999 | New | 326/39 |
| 6,014,038 | A | | 1/2000 | How et al. | |
| 6,020,755 | A | * | 2/2000 | Andrews et al. | 326/39 |
| 6,150,837 | A | * | 11/2000 | Beal et al. | 326/39 |
| 6,194,912 | B1 | | 2/2001 | Or-Bach | |
| 6,236,229 | B1 | | 5/2001 | Or-Bach | |
| 6,245,634 | B1 | | 6/2001 | Or-Bach | |
| 6,294,927 | B1 | | 9/2001 | Yoeli et al. | |
| 6,331,733 | B1 | | 12/2001 | Or-Bach et al. | |
| 6,331,789 | B2 | | 12/2001 | Or-Bach | |
| 6,331,790 | B1 | | 12/2001 | Or-Bach et al. | |
| 6,492,833 | B1 | | 12/2002 | Asson et al. | |
| 6,507,216 | B1 | | 1/2003 | Lane et al. | |
| 6,580,289 | B2 | * | 6/2003 | Cox | 326/40 |

* cited by examiner

Primary Examiner—Vibol Tan
(74) Attorney, Agent, or Firm—Moore & Van Allen PLLC; Steven B. Phillips

(57) ABSTRACT

Distributed RAM in a logic array. A single, customizable, logic array fabric provides both gate array logic and RAM functionality simultaneously while substantially maximizing the amount of configurable metal for routing. The extra semiconductor area in the cells of a metal limited device is used to implement general purpose RAM. Common select lines and read/write lines for the RAM are embedded in the base cells so that the configurable metal (whether via or actual metal layer) over the RAM can be used for routing logic.

11 Claims, 6 Drawing Sheets

DISTRIBUTED RAM IN A LOGIC ARRAY

BACKGROUND

For many years, gate arrays have been used to provide quick-turnaround (quick-turn), low non-recurring-expense (NRE) semiconductor devices for a variety of purposes. Traditionally, wafers are processed up to but not including the first (bottom) metal layer, and saved in inventory. When a customer orders a device to be fabricated for a specific application (an application specific integrated circuit or "ASIC"), the customer only pays for the masks to configure the metal layers, and not the transistor layers below. Thus, NRE is reduced. The wafers can be completed quickly, since only the metal layers remain to be fabricated, reducing turn-around time.

In some of the above-described devices, general purpose, random access memory (RAM) is needed. At one time, to satisfy this need, a separate area of RAM was simply incorporated into the chip. FIG. 1 illustrates such a device. In FIG. 1, blocks of RAM, 100, are incorporated onto chip 102, together with the gate array logic transistors, 104. Metal layers. 105 are provided on top of the chip for routing the gate array logic, and the chip is provided with connection pads 106.

Recently more and more layers of metal have been incorporated into gate array semiconductor devices. Rather than two or three layers of metal, six to eight layers of metal is now common. As a result, gate arrays are no longer very low-NRE, or quick-turn. In order to regain the advantages of earlier gate arrays, several vendors have developed logic arrays, consisting of multiple, substantially identical logic cells, which can be configured for an application with either fewer or cheaper masks. In the case of fewer masks, the total number of metal layers and hence masks used to create the finished device often does not change. Rather, only a reduced subset of the total number of metal layers in a finished device is used to impart the custom configuration to the device. For example, so-called "one-mask" devices, in which only a single metal layer and hence a single mask imparts customization, can reduce both NRE and turn-time. A side-effect of such techniques is that more area is required in order to complete routing. This naturally leads to a mismatch in the metal area required for routing and the transistor area required to implement logic—extra, unused semiconductor is left in the device. The logic cells in the device are referred to as being "metal-limited."

FIG. 2 illustrates the semiconductor layer of a metal-limited device 200. The device consists of an array of identical cells, as shown at 202. In each cell only a portion of the semiconductor, for example the portion shown at 204, is used.

Various ideas have been proposed to make use of the extra silicon in the cells of these metal-limited devices. For example, the extra semiconductor can be used to provide field programmable gate array (FPGA) functionality, test circuitry or to increase device density. Devices are also available that use the extra space to incorporate random access memory (RAM) into each cell. The RAM can then be used to program look-up-tables (LUT's) in the cells. If a particular cell's logic is to be unused, the RAM in that cell can be used as a stand-alone, general purpose RAM device, which can alleviate the need to add a block of RAM to the chip as shown in FIG. 1. However, the RAM in the cell of such a device cannot be used simultaneously with the gate array logic in the cell.

SUMMARY

The present invention provides for the incorporation of RAM into the logic array in a distributed fashion, so that a single cell fabric can provide both logic and RAM functionality simultaneously while substantially maximizing the amount of configurable metal for routing. The extra semiconductor area in the cells of a metal limited device is used to implement general purpose RAM that never needs to be used to configure the logic. Common select lines and read/write lines for the RAM are embedded in the base cells so that the configurable metal (whether via or actual metal layer) over the RAM can be used for routing logic.

According to at least some embodiments of the invention, a mask-configurable semiconductor chip is built to be finished by providing masks to be used in routing metal layers on top of the chip. The chip has an array of logic cells, and at least some logic cells in the array comprise both mask-configurable gate array logic, and random access memory (RAM). The RAM in each of those cells is connected to common select and read/write lines to form distributed RAM so that the RAM is usable simultaneously with the mask-configurable gate array logic.

In some embodiments, the chip is designed to be configured (customized) using less than the actual number of metal (including via) layer masks that will actually be used to create a final device. In some cases, this configuration will be accomplished with a single metal layer mask, which may be either a mask designed to create a layer of actual metal traces, or a layer of vias which move signals between metal layers.

In any case, a completed device is made by first forming the semiconductor layer where cells contain both mask-configurable gate array logic and random access memory (RAM) as described above. Then, the plurality of metal layers are formed top of the semiconductor layer for routing connections. At least some of the plurality of metal layers are customized and are used to configure the device for a specific application.

DETAILED DESCRIPTION OF ONE OR MORE EMBODIMENTS

The present invention will now be described in terms of specific, example embodiments. It is to be understood that the invention is not limited to the example embodiments disclosed. The meaning of certain terms as used in the context of this disclosure should be understood as follows. The term "configuration" and variants such as "configurable" and "configured" refer to the property or process of imparting application-specific function to an integrated circuit chip. The term "metal layer" refers to any layers which are used to make connections to implement the functions of the cells of a device. These metal layers may be the same for every version of a semiconductor device, or they may be used for configuration. In addition, metal layers may contain actual metal routing traces or vias, which provide vertical connectivity between metal routing layers. Finally, the term "chip" and variations such as "integrated circuit chip" or "semiconductor chip" are normally meant to refer to an intermediate device which has not been configured, and may be in the form of a wafer. A finished device such as an application-specific integrated circuit (ASIC) will be referred to as a "device" or with a variant term such as "semiconductor device" or the like. Other terms will either be discussed when introduced, or otherwise should be assumed to have the conventional meaning as understood by persons of ordinary skill in the art.

Figure 1:
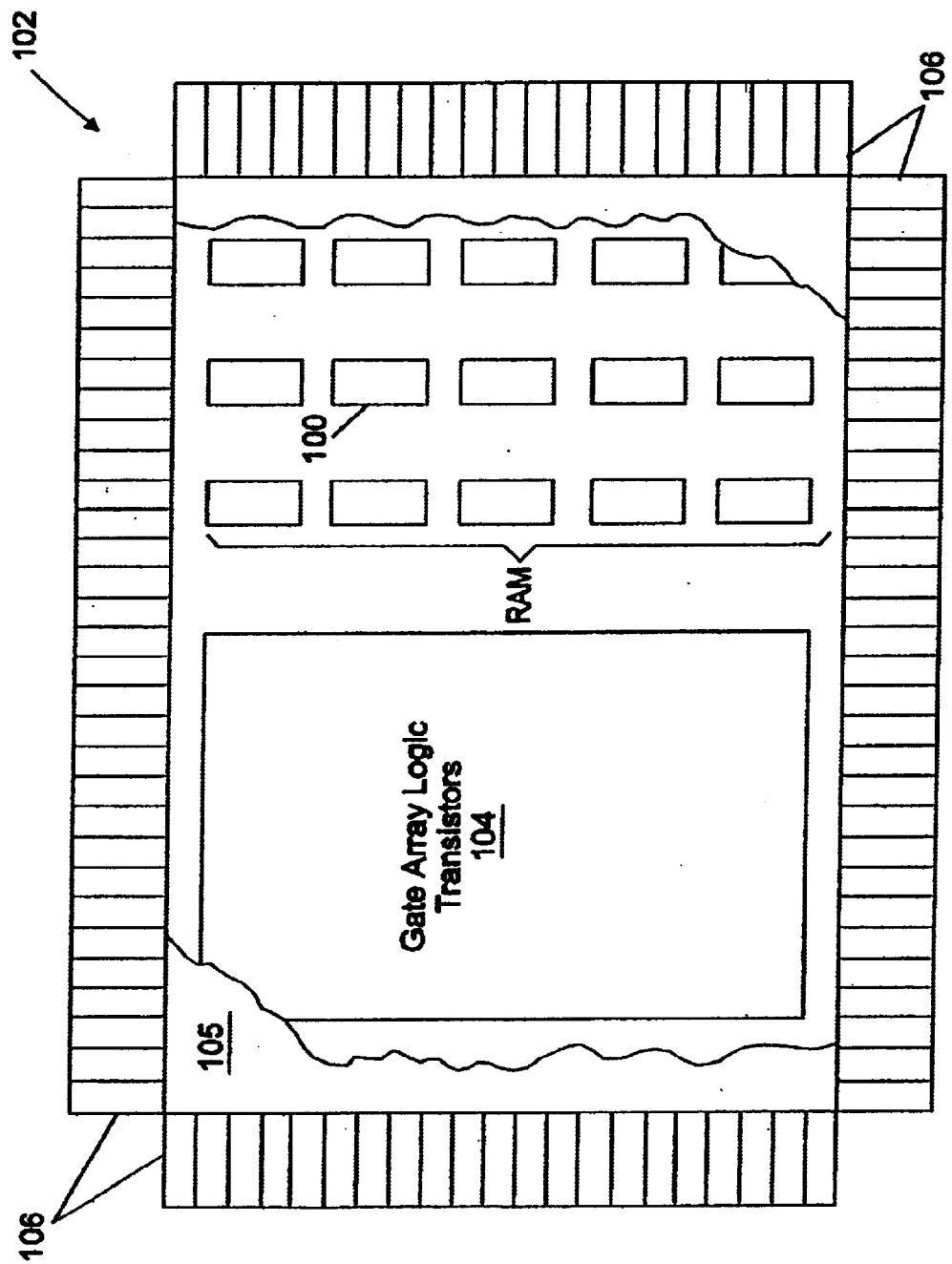
FIG. 1 illustrates a prior art gate array device that also incorporates a block of RAM.
Figure 2:
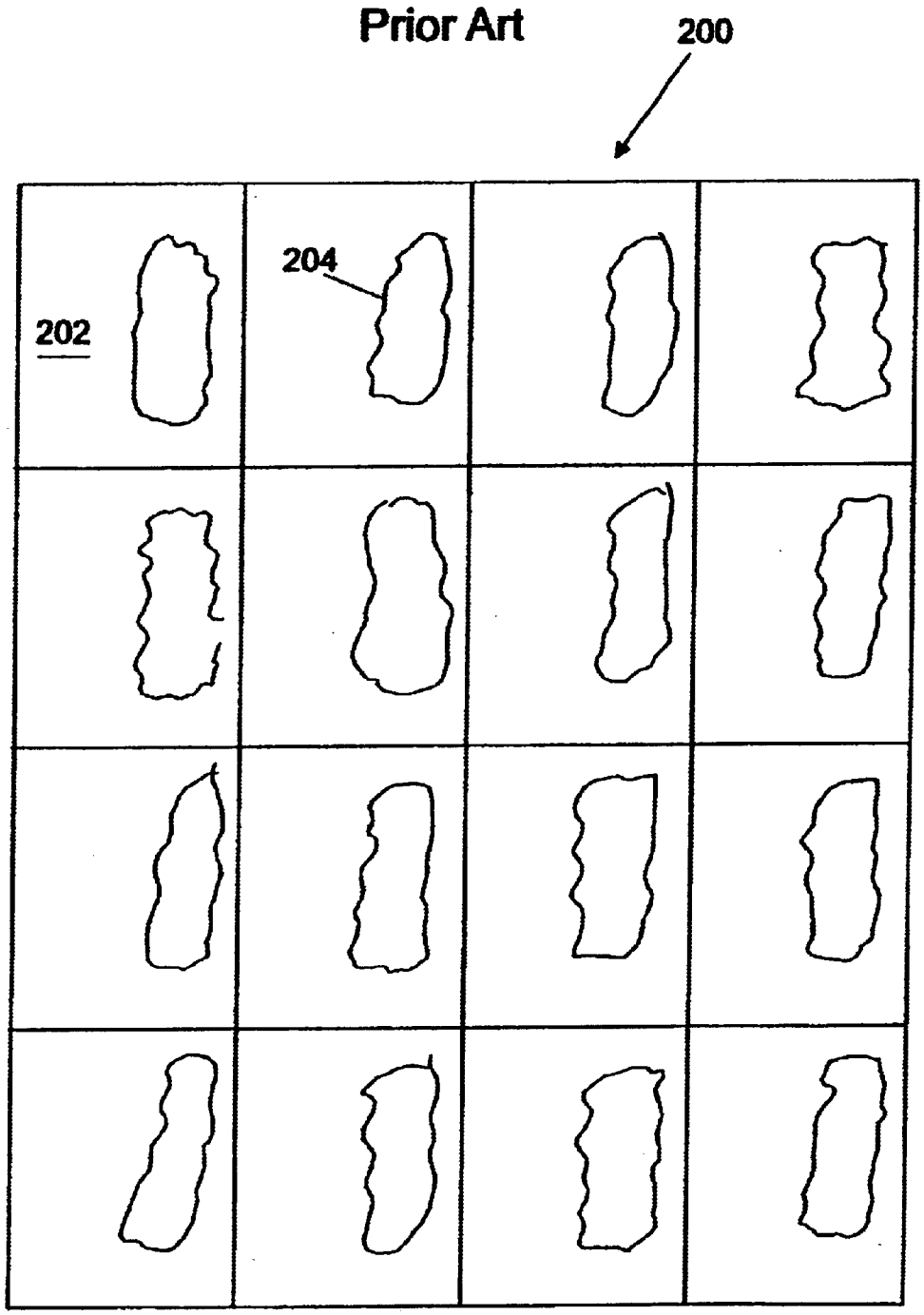
FIG. 2 illustrates the semiconductor layer of a prior art, metal limited device.
Figure 3:
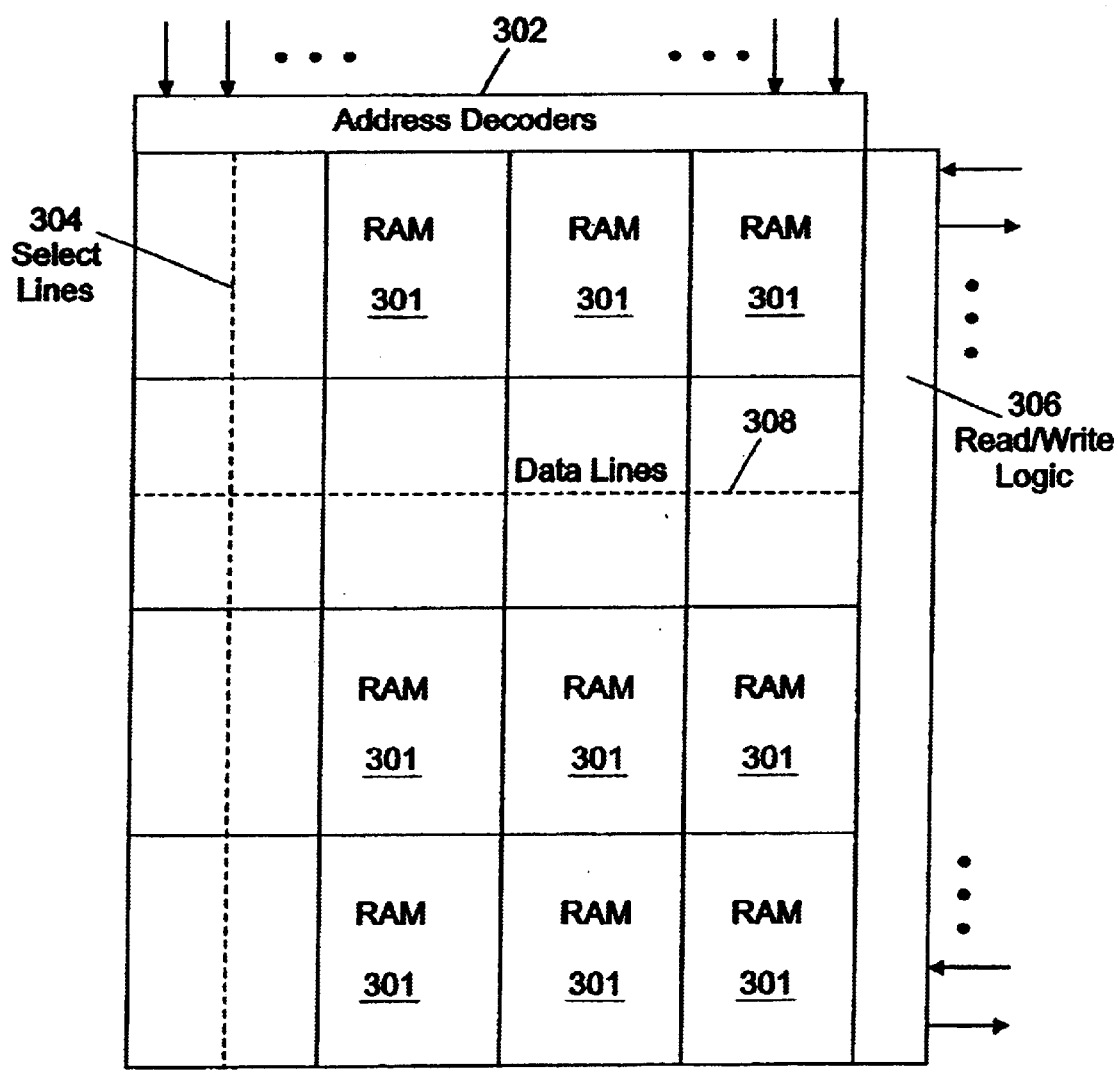
FIG. 3 illustrates a distributed RAM architecture according to at least some embodiments of the present invention.

FIG. 3 is a conceptual, block diagram of a distributed RAM architecture, which is used to implement example embodiments of the invention. The distributed RAM of FIG. 3 consists of multiple, medium sized dual port RAM blocks 301. Not every block of RAM in FIG. 3 is labeled as to do so would adversely effect the clarity of the diagram. In this example, each block of RAM contains 8 by 1 bits. In an actual device, general purpose logic can be added to allow the combination of multiple medium size RAM blocks into larger arrays of RAM. However, a dual port RAM of medium size will satisfy most needs. Additionally, if only a smaller amount of RAM than this is needed, the amount of semiconductor wasted will still be relatively small.

Returning to FIG. 3, address decoders 302 contain the appropriate number of inputs for the chosen RAM architecture. The select lines for the address decoders are common to multiple blocks of RAM. Of course, multiple select lines are present. Only one select line, 304, is shown for clarity. Likewise, read/write logic 306 drives an appropriate number of read/write lines for the specific RAM architecture and size chosen. Data lines from the read/write logic are common to multiple blocks of RAM. Data line 308 is shown for illustrative purposes. Again, multiple data lines are present, but only one is shown for clarity. In the example RAM architecture shown, the select lines are word select lines. Depending on the architecture, select lines could also be address select lines, used to select bits in a column according to an address. In any case, such lines are referred to herein as "select" lines.

Figure 4:
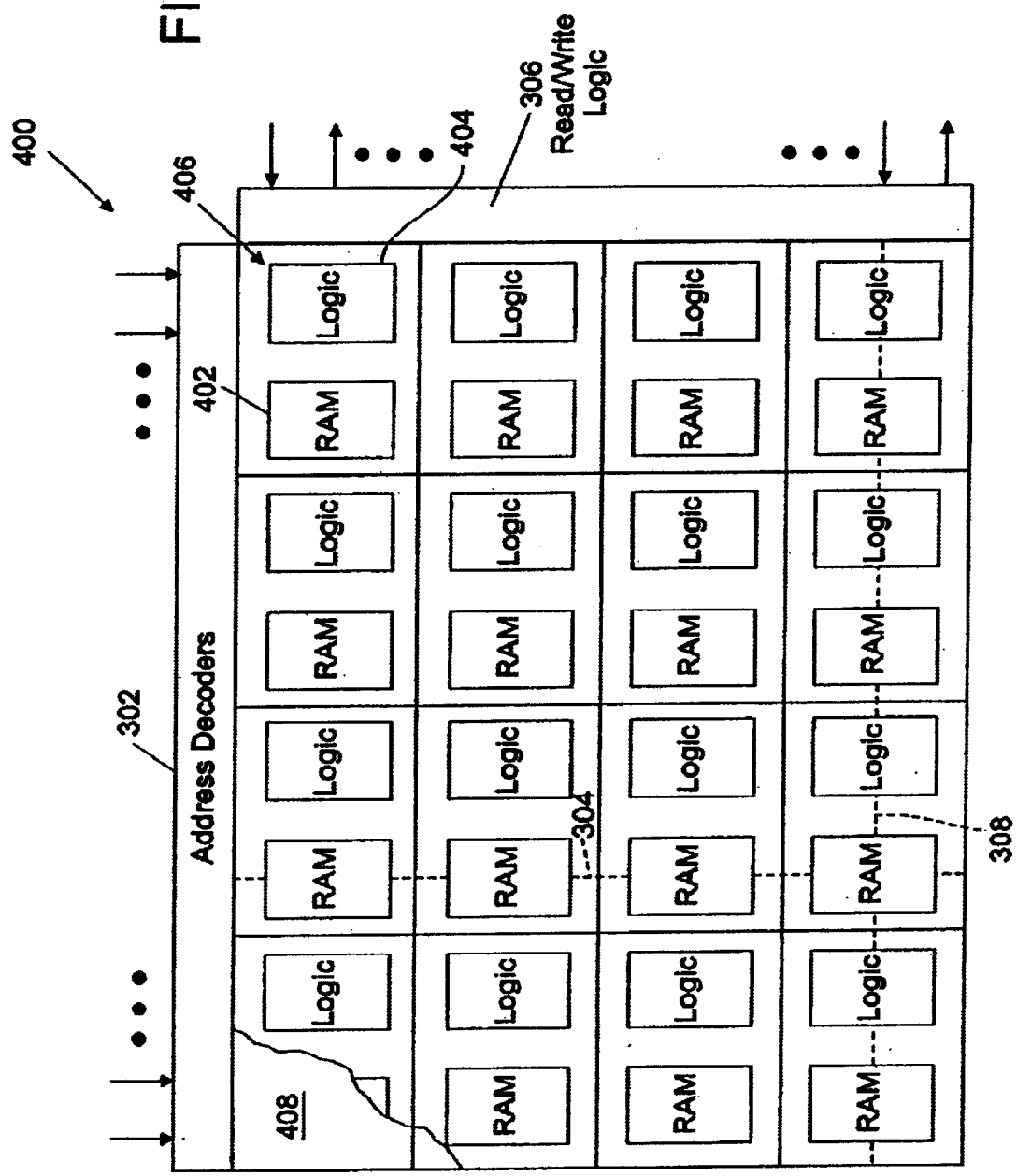
FIG. 4 illustrates both the structure of and method of making a semiconductor layer and a finished device according to the present invention.

FIG. 4 is a conceptual, block diagram illustrating a chip according to the invention, as well as a device, and the method of making the device according to at least some embodiments of the present invention. Like reference numbers are used for like structures across FIGS. 3 and 4 in this disclosure. The device, 400, includes read/write logic 306 and address decoders 302 just as in FIG. 3. The device of FIG. 4 also includes select lines 304 as shown in FIG. 3. The device 400 also includes data lines 308 as shown in FIG. 3. In this case, the RAM blocks are disposed within multiple, substantially identical logic cells 406. Each logic cell 406 contains RAM block 402 and mask configurable gate array logic block 404. It should be noted that the select and data lines for the RAM in the example embodiments are embedded within the semiconductor, for example, polysilicon portion of the chip, or are routed via the non-configurable metal layers. These lines are not routed through the configurable metal layers.

In one example, 8 by 1 RAM blocks are used in FIG. 3, and each block has eight, one-bit addressable registers. Thus, three select lines are provided per column to enable a word select function for the address decoders. In this case, a single read and single write line are provided per row. Although a specific word select is communicated to multiple RAM blocks, the read/write logic determines which one is actually read or written, as the case may be, in a particular column of distributed RAM. Other memory architectures can be used. In particular however, having word select lines in one direction and data lines in another works well. Word lines are for selecting a column (assuming vertical word lines) of RAM bits to be read or written. The data lines either communicate the data to be written to the selected column (assuming horizontal data lines) or allow data from the selected column to be transmitted to read/write logic at the edge. A dual-port RAM architecture can be implemented, among other ways, by having two sets of word select and data lines present, one for each port.

The semiconductor chip shown in FIG. 4 is made into the finished device, 400, by adding multiple metal layers, 408, shown in cutaway, to the semiconductor chip. At least some of the layers impart configuration information to the device. In a practical integrated circuit device, wafers may be held in inventory with no metal layers present, and then all of the metal layers added when a configured device is ordered. This process may be the same even if some of the metal layers are the same from one application specific device to another. It would also be possible to design a system whereby some of the metal layers, which do not impart configuration specific properties to the device, have already been added to the intermediate semiconductor chip.

Having described a RAM architecture and an overall design for a logic array according to the present invention, some example gate array logic architectures which can be used with the invention will now be discussed. It must be emphasized that the choice of gate array logic cell architectures to be used with the distributed RAM invention described herein is almost infinite. The examples described are provided merely to completely enable some embodiments of the invention and are not intended to limit the scope or spirit of the invention. Ideally, to maintain the advantages of low NRE and quick turn, the gate array logic used in a chip and device according to the invention should be configurable with as few masks as possible.

U.S. Pat. No. 6,014,038 to How et al. describes a function block architecture which requires minimal masking steps, and is incorporated herein by reference. With the architecture described by How, each function block is generally composed of two computation modules and a communication module, each having fixed internal architecture, but whose functions can be varied by varying input signals to each module. Computation modules are identical mirror images of each other. Each computation module is divided into two stages. One stage contains one multiplexer, and a second stage generally includes three multiplexers.

U.S. Pat. No. 6,294,927 to Yoeli et al. describes a configurable cell architecture for a customizable logic array device, and is incorporated herein by reference. The architecture of Yoeli requires either a single metal trace layer, or a metal trace layer and a via layer for configuration. Each logic unit includes multiplexers, a NAND gate, and an inverter. Alternative architectures are discussed, however, simplicity is a particular feature of the cells described.

Another logic cell architecture that can be used with the invention is described in U.S. Pat. No. 6,331,790 to Or-bach et al., which is incorporated herein by reference. Still another cell architecture which could work with the invention is described in U.S. Pat. No. 5,068,603 to Mahoney, which is also incorporated herein by reference. Still another cell architecture which can be used with the present invention is described in FIGS. 5 and 6 of the present disclosure.

Figure 5:
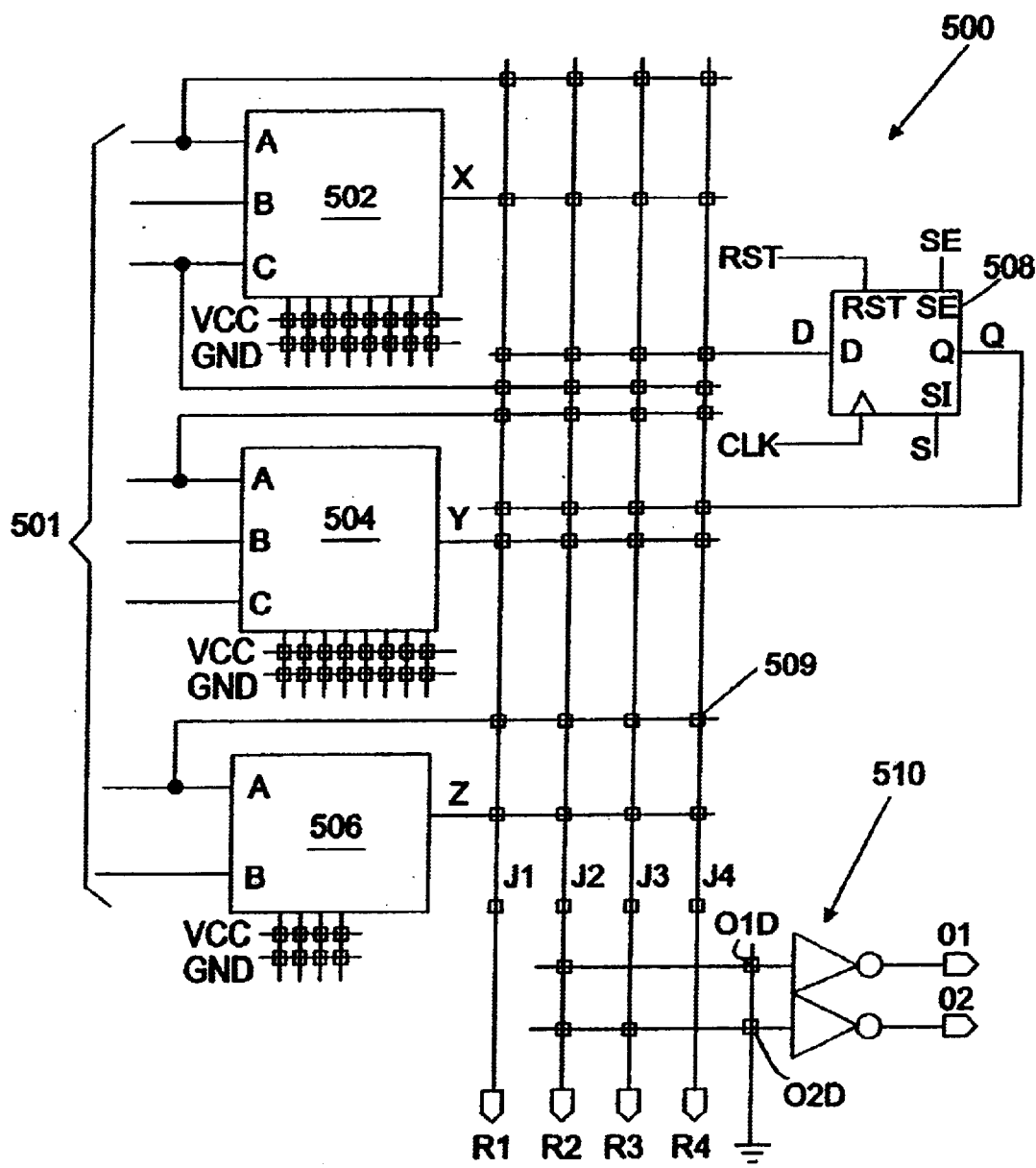
FIG. 5 is a logic diagram for a cell of one of many possible gate array architectures that can be used with the invention.

FIG. 5 is a detailed logic diagram of one of the cells of an architecture, which can be configured with a single via mask. The cell, 500, includes three look-up tables (LUT's). The LUT inputs are shown at 501. LUT 502 is a three logic input LUT. LUT 504 is a three logic input LUT. LUT 506 has two logic inputs. There is routing internal to the cell to allow any LUT to drive at least one input on any other LUT. Any LUT can also drive the D input of flip-flop 508. The configuration can be controlled in part by selecting via connections at positions illustrated as shown at 509. The cell also includes two inverters 510, which can instead be buffers. The inverters or buffers serve to increase drive strength. Jumpers J1, J2, J3 and J4 can provide an increase in density by allowing some configuration of this portion of the cell outside of using the configurable metal layers.

A LUT, as shown in FIG. 5, is built from one or more multiplexers with constant data inputs. The logic inputs drive the select lines of the multiplexers (not to be confused with select lines for the RAM as previously discussed). A LUT of N inputs can be implemented with a multiplexer of $2^n$ data inputs programmably tied to one of the supply voltages through vias. In a practical semiconductor device, each LUT can be provided with appropriate test data lines to carry data from a selected column of the LUT to the edge of the chip die for testing. Of course, in such a case lines are also provided to determine which column's data is to be communicated to the edge. The lines associated with this testing are omitted from FIG. 5 for clarity.

Figure 6:
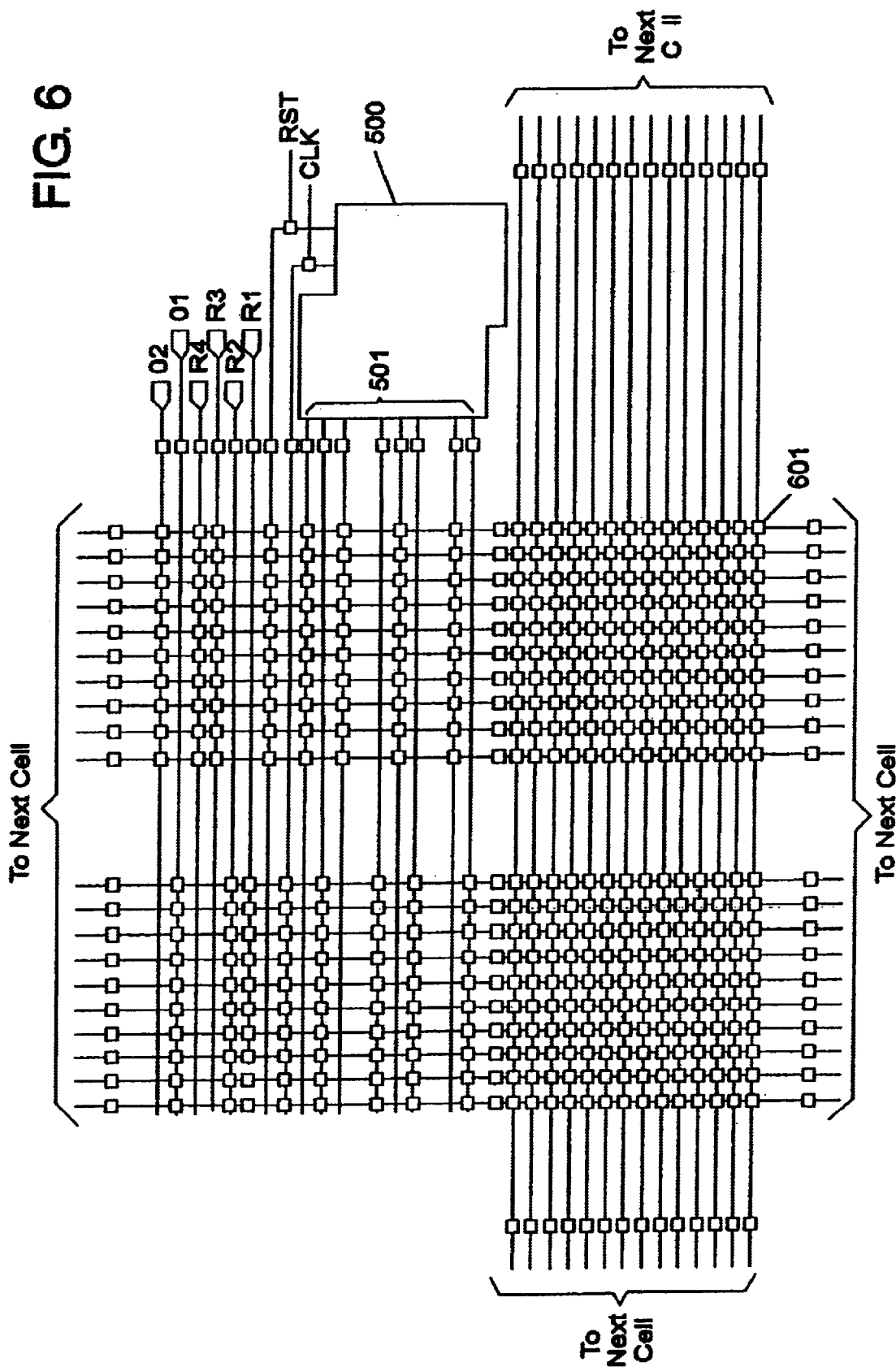
FIG. 6 illustrates the gate array architecture that encompasses the logic shown in FIG. 5.

FIG. 6 illustrates how cell logic 500 of FIG. 5 is connected to other logic cells in an actual device. LUT inputs 501 are again shown in FIG. 6. Vias are illustrated as shown at 601. Lines to gate array logic blocks in adjacent cells are also shown. Inputs, which are connected to outputs of the logic cell where the connections cannot be shown directly for clarity, are labeled appropriately. The reset and clock lines which are shown connected to flip-flop 508 of FIG. 5 are also labeled in FIG. 6.

With the architecture shown in FIGS. 5 and 6, an 8 by 8 array of logic cells would have 64 connection pads. The exact clocking and reset scheme would depend on the implementation, however, in one embodiment, there is a clock and reset signal generator every eight rows of logic cells. Additional information on the via layer programmed architecture described immediately above can be found in U.S. patent application Ser. No. 60/296,854, filed Jun. 8, 2001, which is incorporated herein by reference.

Specific embodiments of an invention are described herein. One of ordinary skill in the semiconductor arts will quickly recognize that the invention has other applications in other environments. In fact, many embodiments and implementations are possible. The following claims are in no way intended to limit the scope of the invention to the specific embodiments described above.

I claim:

1. A mask-configurable semiconductor chip comprising an array of logic cells, wherein at least some logic cells in the array comprise:
   mask-configurable gate array logic; and
   random access memory (RAM), wherein the RAM in each of the at least some logic cells is connected to common select and read/write lines to form distributed RAM so that the RAM is usable simultaneously with the mask-configurable gate array logic.

2. The mask-configurable semiconductor chip of claim 1 wherein the gate array logic is arranged to be substantially configured with a single layer mask.

3. The mask-configurable semiconductor chip of claim 2 wherein the single layer mask is a via mask for producing a via layer.

4. A semiconductor device comprising:
   a semiconductor layer further comprising:
      mask-configurable gate array logic; and
      random access memory (RAM), wherein the RAM in each of the at least some logic cells is connected to common select and read/write lines to form distributed RAM so that the RAM is usable simultaneously with the mask-configurable gate array logic; and
   a plurality of metal layers disposed an top of the semiconductor layer for routing connections wherein at least some of the plurality of metal layers configures the gate array logic.

5. The semiconductor device of claim 4 wherein the gate array logic is configured with only some of the plurality of metal layers.

6. The semiconductor device of claim 4 wherein the gate array logic is substantially configured with only one of the plurality of metal layers.

7. The semiconductor device of claim 6 wherein the one of the plurality of metal layers is a via layer.

8. A method of making a semiconductor device comprising the steps of:
   forming a semiconductor layer comprising mask-configurable gate array logic and random access memory (RAM), wherein the RAM in each of the at least some logic cells is connected to common select and read/write lines to form distributed RAM so that the RAM is usable simultaneously with the mask-configurable gate array logic; and
   forming a plurality of metal layers disposed an top of the semiconductor layer for routing connections wherein at least some of the plurality of metal layers configures the gate array logic.

9. The method of claim 8 wherein the gate array logic is configured with only some of the plurality of metal layers.

10. The method of claim 8 wherein the gate array logic is substantially configured with only one of the plurality of metal layers.

11. The method of claim 10 wherein the one of the plurality of metal layers is a via layer.

* * * * *